(12) United States Patent
Owada et al.

(10) Patent No.: US 7,715,579 B2
(45) Date of Patent: May 11, 2010

(54) TONE CONTROL CIRCUIT FOR HEARING AID AND THE LIKE

(75) Inventors: Kenjiro Owada, Tokyo (JP); Takashi Kuno, Akiruno (JP); Masahiko Ohgushi, Tachikawa (JP)

(73) Assignee: Mimy Electronics Co., Ltd., Tokyo (JP)

( * ) Notice: Subject to any disclaimer, the term of this patent is extended or adjusted under 35 U.S.C. 154(b) by 1221 days.

(21) Appl. No.: 11/266,460

(22) Filed: Nov. 3, 2005

(65) Prior Publication Data

US 2007/0098186 A1    May 3, 2007

(51) Int. Cl.
*H04R 25/00* (2006.01)
(52) U.S. Cl. .................... 381/320; 381/312; 381/317
(58) Field of Classification Search .............. 381/101, 381/320
See application file for complete search history.

(56) References Cited

U.S. PATENT DOCUMENTS 5,138,665 A * 8/1992 Ito ........................ 381/104
5,574,792 A * 11/1996 Konno .................... 381/103

\* cited by examiner

*Primary Examiner*—Curtis Kuntz
*Assistant Examiner*—Matthew Eason
(74) *Attorney, Agent, or Firm*—Jordan and Hamburg LLP

(57) ABSTRACT

A tone control circuit includes a capacitor-resistor circuit; a resistor-capacitor circuit which is connected to the capacitor-resistor circuit; and a variable resistor which is connected between the resistor-capacitor circuit and capacitor-resistor circuit or a connecting point of both circuits. The variable resistor controls tone easily at high and low frequencies without change of the loudness when voice is output.

10 Claims, 4 Drawing Sheets

Prior Art

TONE CONTROL CIRCUIT FOR HEARING AID AND THE LIKE

FIELD OF THE INVENTION

The present invention relates to a tone control circuit for a hearing aid, sound equipment and the like.

BACKGROUND OF THE INVENTION

The conventional tone control circuit for the hearing aid including a control circuit at high frequency and low frequency is provided so as to control independently through the capacitor-resistor circuit and resistor-capacitor circuit as shown in FIG. 7.

Therefore, since the control points are divided by two points, it is too hard to control by the user of the hearing aid. In addition, since the loudness (sensuous volume) changes when the voice is output even though it is controlled, the user has to control the tone and volume at the same time, and it is hard to control by the user. So the user requests the doctor, specialists, to make adjustments. Therefore, it is hard to keep the comfortable state to use the user always.

SUMMARY OF THE INVENTION

Accordingly, it is an object of the present invention to provide a tone control circuit for a hearing aid which can control the tone easily at high and low frequency without change of the loudness (sensuous volume) when the voice is output.

The present invention is understood to encompass embodiments which include all or only a portion of the above objects, features and advantages which, unless recited in claims defining the invention, are understood not to limit interpretation of such claims. The above, and other objects, features and advantages of the present invention will become apparent from the following description read in conjunction with the accompanying drawings, in which like reference numerals designate the same elements.

It is to be expressly understood, however, that the drawings are for the purpose of illustration and description only, and are not intended as a definition of the limits of the invention.

DETAILED DESCRIPTION OF THE PREFERRED EMBODIMENTS

Figure 1:
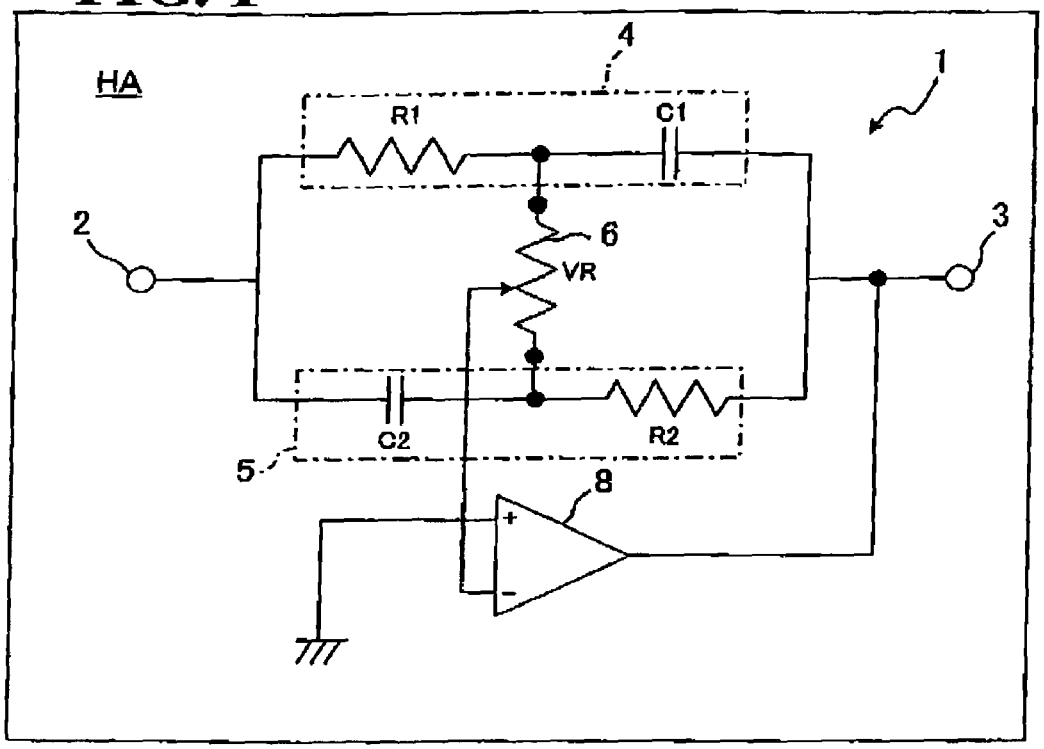
FIG. 1 is a circuit diagram showing a first embodiment of the present invention.

Preferred embodiments of the present invention are described in more detail below referring to the accompanying drawings. An understanding of the present invention may be best gained by reference FIGS. 1 and 2.

The reference numeral 1 is a tone control circuit for a hearing aid HA and the like. The tone control circuit 1 is installed into the hearing aid, sound equipment and the like, an input part 2 is connected to the signal source (microphone, etc.) and an output part 3 is connected or installed into earphones, speakers and the like.

The tone control circuit 1 is comprised of a capacitor-resistor (CR) circuit 4 connected between the input part 2 and output part 3; a resistor-capacitor (RC) circuit 5 which is connected to the capacitor-resistor circuit 4 in parallel; a variable resistor (VR) 6 which is connected between the resistor-capacitor circuit 5 and capacitor-resistor circuit 4 or a connecting point of both circuits. In addition, the variable resistor 6 has a variable terminal 7 which is connected to an input part of an inverting amplifier 8, and an output part of the inverting amplifier 8 is connected to the output part 3.

For the tone control circuit 1 described above, when the output of the variable resistor 6 occurs at the side of the resistor-capacitor circuit 4 at the frequency domain, it acts as the same as the LPF (Low Pass Filter) circuit (phase is backward, that is, it reacts negatively) so that it has the characteristic of −6 dB/oct as is known.

On the other hand, when the output of the variable resistor 6 occurs at the side of the capacitor-resistor circuit 5 at the frequency domain, it acts as the same as the HPF (High Pass Filter) circuit (phase is forward, that is, it reacts positively) so that it has the characteristic of +6 dB/oct as is known. When the output from the variable resistor 6 is positioned at middle range, the frequency characteristic is a plane obviously with remaining both frequency characteristics in equilibrium.

Figure 2:
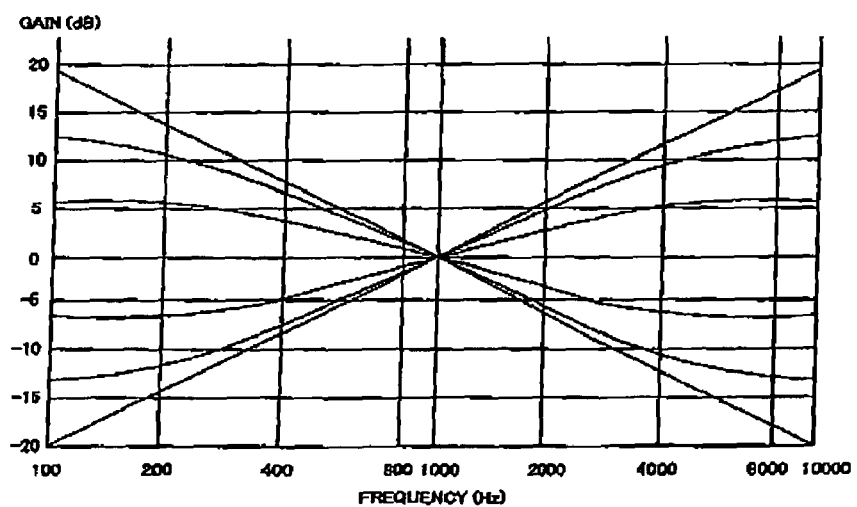
FIG. 2 is an explanation view of a characteristic of a tone control showing a first embodiment of the present invention.

For the hearing aid with tone control circuit 1, when the variable resistor 6 is varied, the frequency characteristic of the tone control circuit varies from of +6 dB/oct to −6 dB/oct smoothly and continuously as shown in FIG. 2.

Accordingly, the user can control easily the tone characteristic without the helping of doctors, specialists and the like, and the user can control the characteristic according to the feeling of the user at any time and anywhere.

In addition, C1, C2, R1, R2 in the capacitor-resistor series circuit 4 and resistor-capacitor series circuit 5 are selected almost at the same value, and an amplification degree at the reference frequency is kept constant without the variable influence of the variable resistor 6 when the cut-off frequency of CR is based on the frequency. In addition, the value of the variable resistor is preferably larger than that of R1, R2. FIG. 2 illustrates an actual measurement.

Furthermore, the frequency at the reference point is set at a middle point approximately in full-range of sense of hearing in this embodiment. Since the range of the hearing aid is 200 Hz to 5,000 Hz approximately, the reference point is 1,000 Hz approximately in this case. However, the reference point sets to 1,000 Hz in practice, and the reference point can be changed.

Other embodiments of the present invention will now be described referring to FIGS. 3 to 6. Through the drawings of the embodiments, like components are denoted by like numerals as of the first embodiment and will not be further explained in great detail.

Figure 3:
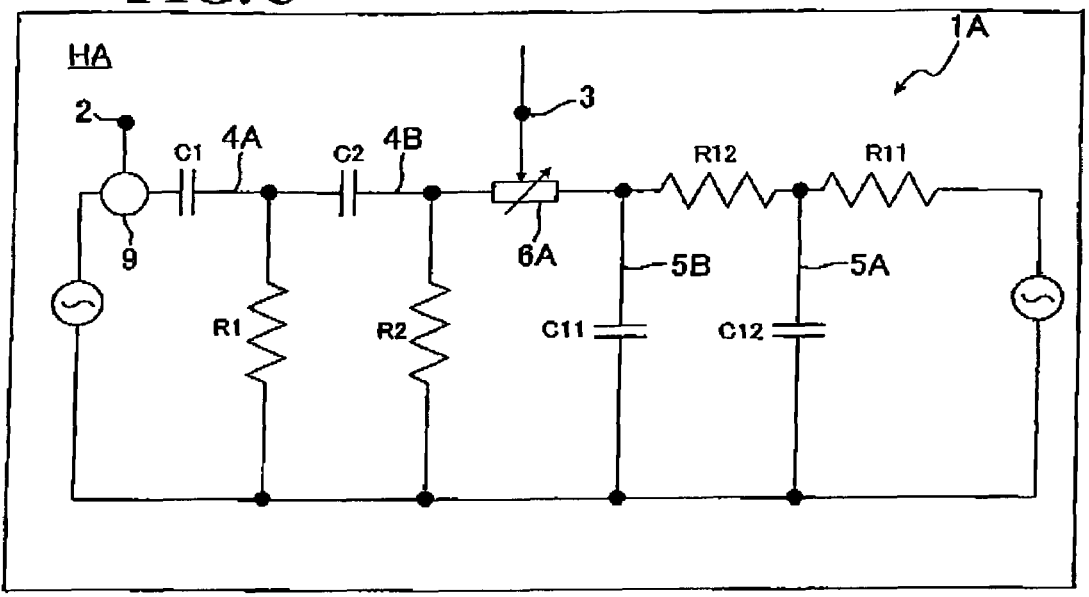
FIG. 3 is a circuit diagram showing a second embodiment of the present invention.
Figure 4:
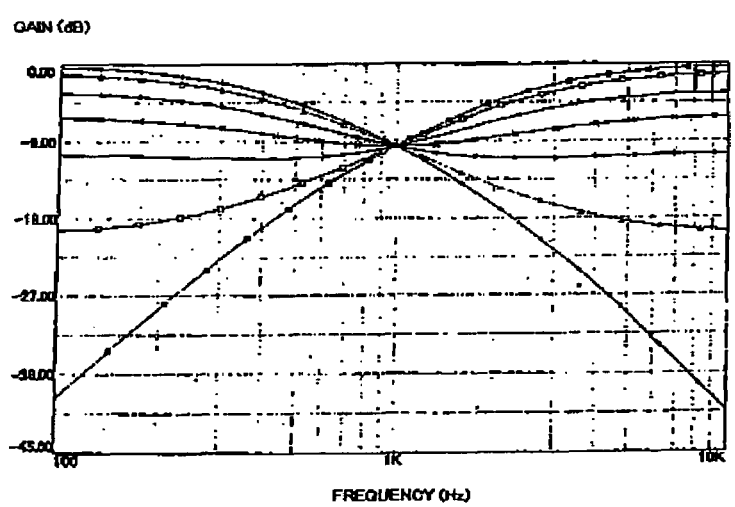
FIG. 4 is an explanation view of a characteristic of a tone control showing a second embodiment of the present invention.

A second embodiment of the present invention is shown in FIGS. 3 and 4 and is distinguished from the first embodiment by the fact that a tone control circuit 1A for a hearing aid HA is comprised of a plurality of capacitor-resistor dividing circuits 4A, 4B; a plurality of resistor-capacitor circuits 5A, 5B connects to the plurality of the capacitor-resistor dividing circuits 4A, 4B by association; a variable resistor 6A connects to a part between output portions of the resistor-capacitor circuits 5A, 5B and capacitor-resistor dividing circuits 4A, 4B; and phase inverters 9 as means for inverting the phase, inverting the inputting signal, connecting input portions of the resistor-capacitor circuits 5A, 5B and capacitor-resistor dividing circuits 4A, 4B. The tone control circuit 1A for the hearing aid and the like according to the second embodiment has similar advantages to that according to the first embodiment.

As shown in FIG. 3, the capacitor-resistor circuit 4A is connected with another capacitor-resistor circuit 4B in a tandem state, and the resistor-capacitor circuit 5A is also connected with another resistor-capacitor circuit 5B. The output from the variable terminal 3 of the variable resistor 6A is used for the tone control.

In addition, the phase inverter 9 as the phase inverting means is connected to the input portions of the capacitor-resistor circuits and resistor-capacitor circuit in this embodiment, and it may be connected to the part between the output portions of the capacitor-resistor circuit 4 or resistor-capacitor circuit 5 and variable resistor 6A.

Furthermore, the phase inverting means 9 may be replaced from the dividing phase inverter, to a differential amplifier circuit, new method and the like when the replacing means can invert the phase of the signal which is input or output.

Moreover, two capacitor-resistor circuits 4A, 4B and resistor-capacitor circuits 5A, 5B are used in this embodiment, and three, four and the like of the capacitor-resistor circuits 4 and resistor-capacitor circuits 5 may be used. In this case, the flatness at the middle point of the frequency lacks balance, however, the damping characteristics goes from strength to strength.

In the tone control circuit 1A of the embodiment, for example, as shown in FIG. 4, C and R are set as follows:
$C1=C2=C11=C12=C$;
$R1=R2=R11=R12=R$; and
$CR=\frac{1}{2\pi} f$.

The variable "f" means a reference frequency of the tone control circuit and middle frequency of the change of the characteristic, it is set around 1 (one) kHz in the hearing aid generally. The horizontal axis in FIG. 4 indicates a frequency, the vertical axis in FIG. 4 indicates an output, and each variable is as follows;
$C=160$ nF;
$R=1$ kohm; and
$VR=500$ kohm.

The frequency characteristic of the tone control circuit shown in FIG. 3 changes upward and downward at high range and low range, and the gradient changes from +6 dB/oct to −12 dB/oct. As a matter of course, it is the base state that the plane at the middle point is plane, but the dent with uninterrupted level from a practical standpoint is formed just as it happened.

Figure 5:
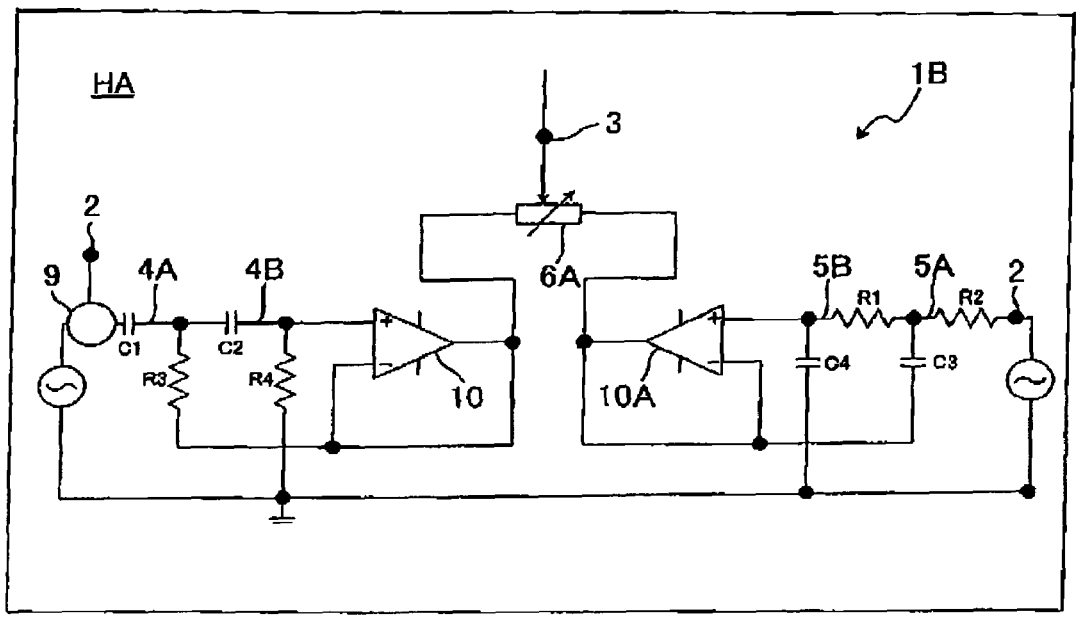
FIG. 5 is a circuit diagram showing a third embodiment of the present invention.
Figure 6:
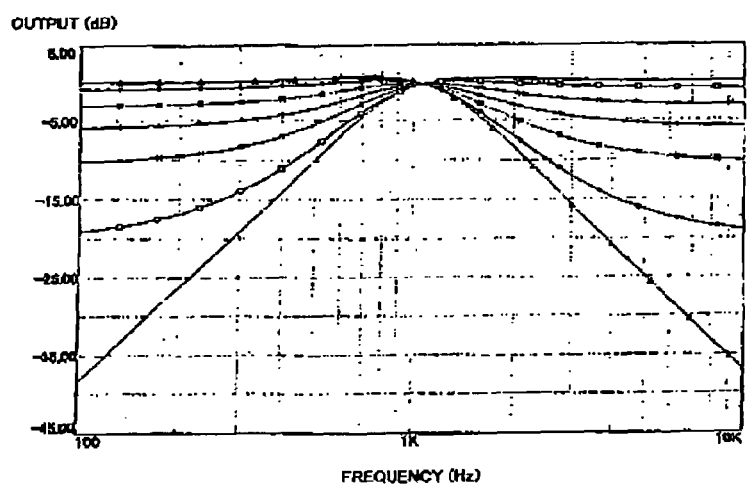
FIG. 6 is an explanation view of a characteristic of a tone control showing a third embodiment of the present invention.
Figure 7:
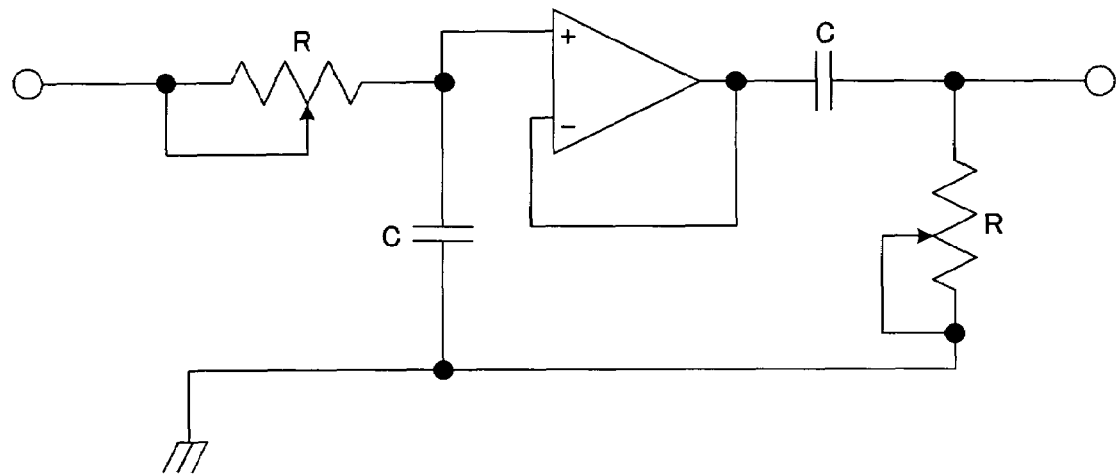
FIG. 7 is a circuit diagram of the prior art.

A third embodiment of the present invention is shown in FIGS. 5 and 6 and is distinguished from the second embodiment by the fact that amplifiers 10, 10A are connected to the capacitor-resistor circuits 4A, 4B and resistor-capacitor circuits 5A, 5B. The tone control circuit 1B for the hearing aid HA and the like according to the third embodiment has similar advantages to that according to the second embodiment, and the characteristic of the tone control shown in FIG. 6 is obtained by the certain constant shift.

As set forth above, the advantages of the invention are as follows:

(1) The tone control circuit includes a capacitor-resistor (CR) circuit; a resistor-capacitor (RC) circuit which is connected to the capacitor-resistor circuit; and a variable resistor (VR) which is connected between the resistor-capacitor circuit and capacitor-resistor circuit or a connecting point of both circuits. Therefore, the frequency characteristic at high and low frequencies can be varied smoothly and continuously.

(2) As discussed above, since the tone control can be operated with only one action easily, the users can fit and adjust the hearing aid and the like by themselves.

(3) As discussed above, the users can fit and adjust the hearing aid and the like by themselves easily. Accordingly, it can keep the best condition to use comfortably.

(4) As discussed above, since the number of parts, including the adjust knob, are reduced as compared to the conventional equipments, it can reduce the cost, improve the reliability and reduce its size.

What is claimed is:

1. A tone control circuit for a hearing aid for receiving an input signal and providing a tone adjusted output signal, comprising:

a control circuit signal input for receiving the input signal;

an inverting amplifier having an inverting input and an amplifier output which outputs said tone adjusted output signal;

a low pass filter series circuit having a low pass filter input terminal, a low pass filter output terminal, and a low pass filter control node;

said low pass filter series circuit including a low pass filter fixed resistor connected in series with a low pass filter capacitor at a low pass filter series connection node, wherein:

said low pass filter fixed resistor has a first low pass filter resistor terminal forming said low pass filter input terminal;

said low pass filter fixed resistor has a second low pass resistor terminal connected in common with a first low pass filter capacitor terminal of said low pass filter capacitor at said low pass filter series connection node;

said low pass filter series connection node is said low pass filter control node; and said first low pass filter capacitor has a second low pass filter capacitor terminal forming said low pass filter output connected to said amplifier output;

a high pass filter series circuit having a high pass filter input terminal, a high pass filter output terminal, and a high pass filter control node;

said high pass filter series circuit including a high pass filter fixed resistor connected in series with a high pass filter capacitor at a high pass filter series connection node, wherein:

said high pass filter fixed resistor has a first high pass filter resistor terminal forming said high pass filter output terminal and connected to said amplifier output;

said high pass filter fixed resistor has a second high pass resistor terminal connected in common with a first high pass filter capacitor terminal of said high pass filter capacitor at said high pass filter series connection node;

said high pass filter series connection node is said high pass filter control node; and said first high pass filter capacitor has a second high pass filter capacitor terminal forming said high pass filter input terminal;

said low pass filter series circuit being connected in parallel to said high pass filter series circuit by parallel connections including said low pass filter input terminal being connected to said high pass filter input terminal, and said low pass filter output terminal being connected to said high pass filter output terminal;

a filter control circuit having a first control input terminal connected to said low pass filter control node, a second control input terminal connected to said high pass filter control node, and said filter control circuit including a variable resistor having:

a fixed resistance outside of said low pass filter series circuit and outside of said high pass filter series circuit, said fixed resistance having a first terminal connected to said high pass filter control node and a second terminal connected to said low pass filter control node;

a wiper contact displaceable along said fixed resistance from a first position to a second position on said fixed resistance; and a wiper contact terminal of said wiper contact connected to the inverting input of said inverting amplifier; and said filter control circuit being configured such that:

varying a position of said wiper contact along said fixed resistance in a first direction toward said high pass filter control node operates to simultaneously effect an increase in treble amplitude and a decrease in bass amplitude in said tone adjusted output signal;

varying a position of said wiper contact in a second direction along said fixed resistance toward said low pass filter control node operates to simultaneously effect a decrease in treble amplitude and an increase in bass amplitude in said tone adjusted output signal; and said tone adjusted output signal is a treble dominated and bass diminished signal when said wiper is at said first position relative to said tone adjusted output signal output when said wiper contact is at a midpoint position, and a bass dominated and treble diminished signal when said wiper is at said second position relative to said tone adjusted output signal output when said wiper contact is at said midpoint position.

2. The tone control circuit of claim 1, wherein said fixed resistance has said second terminal directly connected to said low pass filter control node.

3. The tone control circuit of claim 2, wherein said low pass filter fixed resistor has said second low pass resistor terminal directly connected in common with said first low pass filter capacitor terminal at said low pass filter control node.

4. The tone control circuit of claim 3, wherein said parallel connections include:

said second high pass filter capacitor terminal at said high pass filter input terminal being directly connected to said first low pass filter resistor terminal at said low pass filter input terminal; and said first high pass filter resistor terminal at said high pass filter output terminal being directly connected to said second low pass filter capacitor terminal at said low pass filter output terminal.

5. The tone control circuit of claim 1, wherein said fixed resistance has said first terminal directly connected to said high pass filter control node.

6. The tone control circuit of claim 5, wherein said high pass filter fixed resistor has said second high pass resistor terminal directly connected in common with said first high pass filter capacitor terminal of said high pass filter capacitor at said high pass filter control node.

7. The tone control circuit of claim 6, wherein said parallel connections include:

said second high pass filter capacitor terminal at said high pass filter input terminal being directly connected to said first low pass filter resistor terminal at said low pass filter input terminal; and said first high pass filter resistor terminal at said high pass filter output terminal being directly connected to said second low pass filter capacitor terminal at said low pass filter output terminal.

8. The tone control circuit of claim 1, wherein said fixed resistance has said first terminal directly connected to said high pass filter control node and said second terminal directly connected to said low pass filter control node.

9. The tone control circuit of claim 8, wherein:

said high pass filter fixed resistor has said second high pass resistor terminal directly connected in common with said first high pass filter capacitor terminal of said high pass filter capacitor at said high pass filter control node; and said low pass filter fixed resistor has said second low pass resistor terminal directly connected in common with said first low pass filter capacitor terminal at said low pass filter control node.

10. The tone control circuit of claim 9, wherein said parallel connections include:

said second high pass filter capacitor terminal at said high pass filter input terminal being directly connected to said first low pass filter resistor terminal at said low pass filter input terminal; and said first high pass filter resistor terminal at said high pass filter output terminal being directly connected to said second low pass filter capacitor terminal at said low pass filter output terminal.

* * * * *